BISTABLE CIRCUIT

Filed Feb. 20, 1958

INVENTOR.
CARL M. CAMPBELL, JR.
BY Gordon R. Sanborn
AGENT

United States Patent Office 2,928,010
Patented Mar. 8, 1960

2,928,010

BISTABLE CIRCUIT

Carl M. Campbell, Jr., Bryn Mawr, Pa., assignor to Burroughs Corporation, Detroit, Mich., a corporation of Michigan Application February 20, 1958, Serial No. 716,470

12 Claims. (Cl. 307—88.5)

Figure 1:
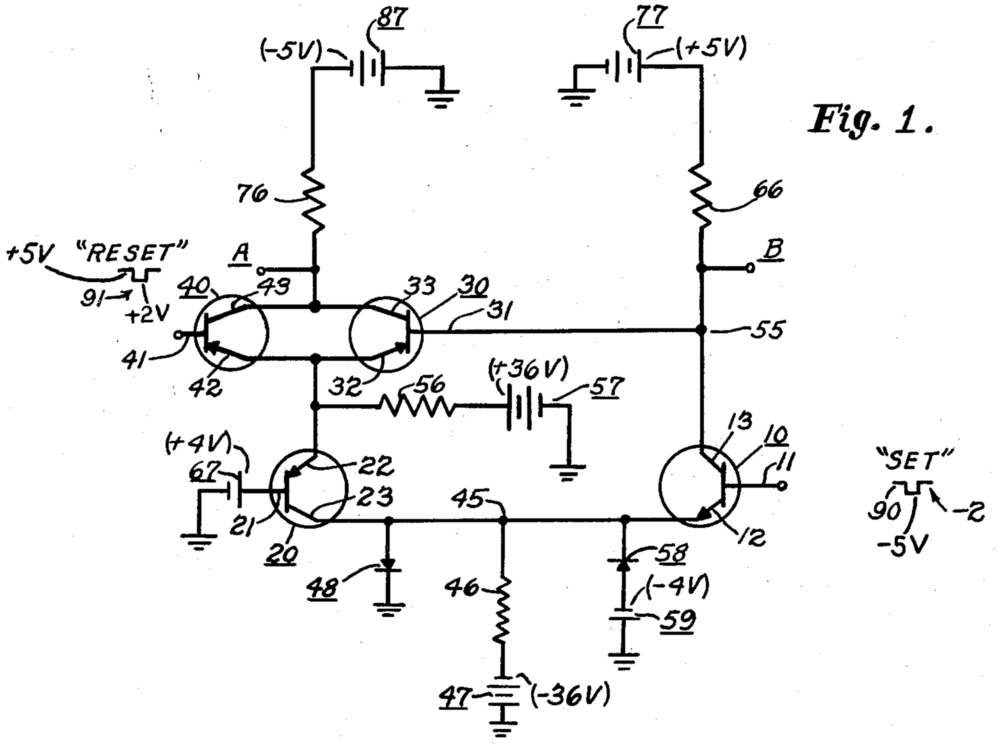

The present invention relates to bistable electronic circuits and more particularly to bistable electronic circuits having set and reset facilities and which switch rapidly from one stable state to the other.

Bistable circuits, often referred to as flip-flop circuits, are widely used in the counting or trigger circuits found in electronic computers. In these and other uses it is often desirable to have a bistable circuit with two signal input points and which can be made to assume a selected one of the stable conditions. Many prior art bistable circuits utilizing transistors have required a large number of circuit components to provide this capability of assuming a given one of its stable conditions, referred to as a set and reset capability. In addition, in many prior art bistable circuits utilizing transistors the transistors must be saturated, and hence a relatively long time interval is required for the circuit to change from one stable condition to the other as a result of the base storage time associated with saturated transistors. This may be disadvantageous in high speed work.

If the particular flip-flop circuit is to be controlled by means of "and" or "or" gates, as is common in electronic computers, it is usually necessary to incorporate a number of external circuit components to accomplish the gating function. In the circuit of the present invention the gating functions are readily accomplished by a minimum number of components which are made an integral part of the flip-flop circuit.

Accordingly, it is an object of the present invention to provide an improved bistable electronic circuit utilizing semiconductor amplifier devices such as transistors.

Another object of the present invention is to provide a bistable transistor circuit utilizing a small number of components to provide set and reset capability.

A further object of the present invention is to provide a set and reset bistable circuit utilizing transistors in a circuit arrangement which materially decreases the time required for the circuit to change from one stable condition to the other.

Still another object of the present invention is to provide a bistable transistor circuit having set and reset capability controlled by internal gating means.

In accordance with the present invention a first transistor of one conductivity type has its emitter-collector circuit connected directly to the emitter-collector circuit of a second transistor of conductivity type opposite to that of the first. An impedance element connected to the junction point of the two emitter-collector circuits serves as a common load element for the two transistors in a manner such that current flow through the second transistor and the impedance element prevents or inhibits conduction of the first transistor. A third transistor having its control electrode coupled with the emitter-collector circuit of the first transistor, and hence its state of conduction controlled by the current flow through the emitter-collector circuit of the first transistor, has its emitter-collector circuit connected in series arrangement with the emitter-collector circuit of the second transistor. A second impedance element connected to the junction point of the emitter-collector circuits of the second and third transistors serves as a common load element for the second and third transistors in a manner such that current flow through the impedance element and the third transistor provides a voltage upon the second transistor of sufficient magnitude to maintain the second transistor nonconductive during conduction of the third transistor. Thus, the circuit has one stable condition wherein the first and third transistors are conductive and another stable condition wherein the second transistor is conductive.

When the circuit is in its first stable condition with the first and third transistors conducting, a set pulse or signal applied to the control electrode of the first transistor changes the circuit to the second of its stable conditions with only the second transistor in a conductive state. Thereafter the repeated application of signals to the control electrode of the first transistor has no effect upon the circuit.

To provide the reset capability a fourth transistor is included in the circuit with its emitter-collector circuit connected in parallel with the emitter-collector circuit of the third transistor. Thus the impedance element which is common to the emitter-collector circuits of the second and third transistors is also common to the emitter-collector circuit of the fourth transistor. Hence, the application of a reset control signal to the control electrode of the fourth transistor during the time that the second transistor is conductive will render the fourth transistor conductive and thereby increase the current flow through the second impedance element. This renders the second transistor nonconductive and thereby permits the first transistor to assume its original conducting condition.

In another embodiment of the present invention the emitter-collector circuit of a fifth transistor is connected in parallel with that of the fourth transistor to provide an "or" gate capability on the "reset." Likewise another transistor is connected in parallel with the first transistor to provide an "and" capability on the "set." In this manner the gating functions are controlled by a minimum number of additional circuit elements which are made an integral part of the bistable circuit.

The novel features of the present invention are set forth in the appended claims. The invention itself, however, both as to its organization and method of operation, as well as additional advantages and objects thereof, will be more clearly understood from the following description when read in conjunction with the accompanying drawing wherein like components bear the same reference numeral throughout, and in which, Fig. 1 is a schematic circuit diagram illustrating a preferred embodiment of the bistable transistor circuit provided in accordance with the present invention, and Fig. 2 is a schematic circuit diagram of a bistable circuit provided in accordance with the present invention which incorporates an internal gating arrangement.

Figure 2:
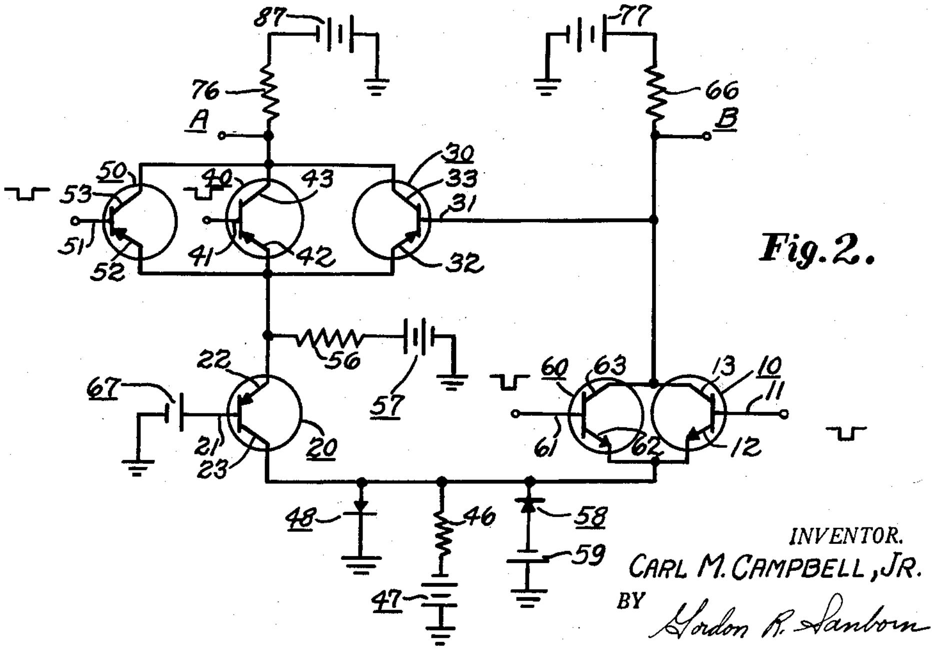

In Fig. 1 an NPN junction transistor 10 having a base electrode 11, an emitter electrode 12, and a collector electrode 13 together with three PNP junction transistors 20, 30, and 40, having base electrodes 21, 31, and 41, emitter electrodes 22, 32, and 42, and collector electrodes 23, 33, and 43, respectively, are included in a preferred embodiment of the bistable circuit of the present invention. Although the circuit diagram illustrated in Fig. 1 incorporates specific conductivity type transistors, it is to be expressly understood that the types shown are for purpose of illustration only and are not to be taken as limitations of the present invention.

The collector electrode 23 of the second transistor 20 is connected directly to the emitter electrode 12 of the first transistor 10 providing a common junction point 45 to which is connected a first impedance element such as a resistor 46 which is also connected to the negative terminal of a first source of direct current (D.C.) potential illustrated as a battery 47 having its positive terminal connected to a point of fixed reference potential referred to as ground. The resistor 46 and battery 47 may advantageously be so selected that a substantially constant current source is provided to avoid transistor saturation. The emitter electrode 22 of the second transistor 20 is coupled by means of a second impedance element such as a resistor 56 with the positive terminal of a second source of D.C. potential illustrated as a battery 57 having its negative terminal grounded. The base electrode 21 of the second transistor 20 is connected to a point of fixed potential illustrated as being provided by a third battery 67 having its negative terminal grounded. The magnitudes of the potentials provided by the various sources of D.C. potential illustrated in the drawing will be more fully explained at a later time.

The base electrode 31 of the third transistor 30 is connected to the collector electrode 13 of the first transistor 10 at a common junction point 55 which is in turn coupled through a dropping resistor 66 to a point of positive potential provided by a fourth source of potential illustrated as a battery 77 having its negative terminal grounded. The emitter electrode 32 of the third transistor 30 is connected directly to the emitter electrode 42 of the fourth transistor 40 and also to the emitter electrode 22 of the second transistor. Hence, the second impedance element illustrated as a resistor 56 is common to the emitter-collector circuits of the second, third, and fourth transistors, and together with the battery 57 may advantageously be adapted to serve as a constant current source. The collector electrode 33 and 43 of the third and fourth transistors are directly interconnected and also coupled through a second dropping resistor 76 to a negative potential provided by a fifth source of D.C. potential illustrated as a battery 87 having its positive terminal connected to ground.

As set forth above the impedance of the resistors 46 and 56 and the voltages of the potential supplies 47 and 57 may be so selected that constant current sources are provided in a manner such that saturation of the various transistors is prevented. To further insure nonsaturation of the transistor 20, a diode 48 having its anode connected to the emitter 12 and its cathode grounded may be included in the circuit to limit the potential upon the emitter 12 to values which are never more positive than ground. As illustrated in the drawing, the base electrode 11 of the first transistor 10 is identified as a "set" signal input point, and the base electrode 41 of the fourth transistor 40 is identified as a "reset" signal input point. Thus the base electrodes 11 and 41 are to be coupled with signal sources which provide negative going control signals. The emitter 12 of transistor 10 is clamped to the negative potential provided by a battery 59 having its positive terminal grounded, by means of a clamping diode 58 which has its cathode connected to the emitter 12 and its anode connected to potential source 59. The base of transistor 11 is maintained positive with respect to the potential of battery 59 in the absence of a negative going control signal, and negative with respect to the potential of battery 59 in response to a control signal. In a similar manner the potential of the base 41 is normally positive with respect to the potential of battery 67 in the absence of a "reset" signal and becomes negative with respect to battery 67 during the occurrence of a "reset" signal.

To further illustrate with more particularity the operation of the bistable circuit of Fig. 1, a particular set of values for the voltages of the various sources of D.C. potential are included in parentheses adjacent to their respective sources. It is to be expressly understood that the particular values shown are only for purpose of illustration, and it is to be further understood that although a plurality of voltage sources are illustrated to facilitate the explanation and teachings of the operation of the present invention, only one source of potential having various voltage taps thereon would be required.

As set forth above, in the absence of any input signal to the circuit the first transistor 10 tends to conduct as a result of the base 11 being maintained at a potential which is more positive than the emitter 12 providing the transistor 20 does not conduct and raise the potential at point 45 to ground. The potential difference between the voltage source 57 and the voltage sources 67 and 77 is such that the emitter-base junctions of the transistors 20 and 30 tend to be forwardly biased. However the impedance of the resistor 56 and potential of battery 57 are so selected that the current flowing through resistor 56 as a result of one of said transistors 20 or 30 being conductive serves to maintain the other nonconductive. That is, as soon as one transistor conducts its emitter potential follows its base potential. Since the emitters 22, 32, and 42 are always at equal potentials, the transistor with the lower base potential will be conductive.

Assuming the initial condition of the circuit to be that in which the first transistor 10 is conductive, the current flow from the potential source 77 through the dropping resistor 66 and the collector-emitter circuit of the first transistor 10 causes the potential of the base 31 of the third transistor 30 to become negative with respect to the fixed potential upon the base of the second transistor 20. Hence, the third transistor 30 is rendered conductive causing current to flow through the resistor 56, thereby creating a potential drop sufficient to maintain the emitter 22 of the second transistor 20 negative with respect to the potential maintained by the third source of D.C. potential 67 upon the base 21. Thus the second transistor 20 is maintained nonconductive.

The magnitude of the various impedance elements and the amplitude of the D.C. potentials is so selected that when the first transistor 10 is conducting the base of the third transistor 30 is more negative than the base of the fourth transistor 40. Hence, the fourth transistor 40 remains normally nonconductive.

When a negative "set" signal 90 is applied to the base of the first transistor 10 to place the base 11 more negative than battery 59 the emitter will try to follow the base but will be clamped to the potential of battery 59, and transistor 10 thus becomes nonconductive. This causes its collector potential to rise to the positive voltage of the source of potential 77, thereby raising the base potential of the third transistor 30 above the base potential of the second transistor 20. As the base of the third transistor becomes more positive the emitters 22 and 32 become more positive until a condition is established such that the emitter-base junction of the second transistor is more forwardly biased than that of the third transistor. Hence, the second transistor is rendered conductive, with the current flow through the resistor 56 maintaining the emitter-base junction of the third transistor 30 backwardly biased. The value of the impedance elements and of the voltage supplies is advantageously selected to provide rapid switching but prevent saturation of the transistors.

As the second transistor 20 conducts, its emitter-collector current flows through the resistor 46 which is common to the emitter-collector circuits of the first and second transistors. Thus the junction 45 of the collector 23 and the emitter 12 of the second and third transistors, respectively, is raised to a potential such that the emitter-base junction of the first transistor becomes backwardly biased to the extent that removal of the set signal 90 from the base 11 does not cause the first transistor to become conductive. Hence, the circuit is switched from its first stable condition wherein the first and third transistors were conducting to the condition where the second transistor is conducting. The fourth transistor remains nonconductive since its base is normally more positive than that of transistor 20.

The circuit will then remain in its second stable condition until a negative going reset signal 91 is applied to the base of the fourth transistor 40 to make its base more negative than that of transistor 20, rendering the fourth transistor conductive. When the emitter-base junction of the fourth transistor is thus forwardly biased the current passing through the load resistor 56 switches from transistor 20 to transistor 40. Hence, the second transistor 20 becomes nonconductive permitting the junction 45 between the collector and the emitter of the second and first transistors to become more negative. As soon as the junction 45 reaches a potential which is negative with respect to the quiescent voltage maintained upon the base 11 of the first transistor 10, the first transistor is rendered conductive. When the first transistor becomes conductive current flow through the dropping resistor 66 causes the base 31 of the third transistor to again become negative with respect to the quiescent voltage of the base 41 of the fourth transistor. Thus when the reset signal 91 is removed from the base 41, the fourth transistor is rendered nonconductive and the third transistor is rendered conductive. The conduction of the third transistor 30 and the resultant current flow through resistor 56 serves to maintain the emitter-base junction of the second transistor 20 backwardly biased, and thereby place the circuit in its first stable condition.

Output signals from the circuit can of course be derived from various points, and thus for purpose of illustration a first signal output terminal A is connected to the collector end of the resistor 76, and a second signal output terminal B is connected to the collector end of the resistor 66. Thus a signal is provided at the signal output terminal A which has a potential equal to that of the battery 87 when the second transistor 20 is conducting, and a more positive potential during the time that the first and third transistors 10 and 30 are conducting. In like manner the potential of the signal provided at the second signal output terminal B varies from a positive potential equal to that of the battery 77 when the second transistor is conducting to a more negative potential during conduction of the first and third transistors. Thus it is seen that the bistable circuit of the present invention provides positive and negative going output signals and hence can serve to control either NPN or PNP transistors which might be coupled with the signal output terminals.

In Fig. 2 a further embodiment of the present invention is illustrated which is similar to the circuit of Fig. 1, but includes an additional PNP transistor 50 and an additional NPN transistor 60 to provide "or" and "and" gating arrangements in a manner such that the gating circuits are internal to the bistable circuit. The sixth transistor 60 has an emitter electrode 62 connected to the emitter 12 of the first transistor, and a collector electrode 63 connected to the collector 13 of the first transistor. Thus the emitter-collector circuits of the first and sixth transistors are connected in parallel. In a similar manner the fifth transistor 50 has an emitter electrode 52 connected to the emitter 42 of the fourth transistor, and a collector electrode 53 connected to the collector 43 of the fourth transistor. Hence the emitter-collector circuits of the fourth and fifth transistors are connected in parallel.

The sixth transistor 60 has a base electrode 61 which is maintained at a potential corresponding to the potential on base 11 and hence is positive with respect to the potentials of the batteries 47 and 59 yet negative with respect to ground, thus the sixth transistor tends to be conductive in the absence of a control signal applied to the base electrode 61 when transistor 20 is nonconductive in the same manner as the first transistor 10. If the potentials of bases 11 and 61 are identical the two transistors will be equally conductive, but if one is slightly more positive that transistor alone will conduct. To change the circuit from the condition wherein the transistors 10 and/or 30 are conductive to the condition where the second transistor 20 is conductive, the first transistor 10 and the sixth transistor 60 must be prevented from conducting by the simultaneous application of negative going signals to their respective control electrodes. Thus an internal "and" gate is provided for the bistable circuit of the present invention.

The fifth transistor 50 has a base electrode 51 which is maintained at a potential sufficiently positive with respect to the potential of the emitter 52 to render the fifth transistor normally nonconductive in the absence of input signals to the base electrode. Thus when the second transistor 20 is the only conducting transistor in the bistable circuit, the application of a negative signal to the base electrode of either the fourth transistor 40 or to the base electrode of the transistor 50 to render the fourth or fifth transistor conductive will switch the current flow through the resistor 56 and transistor 20 to transistor 40 or 50, thereby rendering the second transistor 20 nonconductive.

Although the resistance of the various impedance elements may be varied in accordance with the particular use of the bistable circuit, the following values for the circuit of Fig. 1 are listed by way of example, the particular resistances having been selected for use in conjunction with the voltages illustrated in parentheses in Fig. 1 in a manner such that sufficient current is provided for proper circuit operation but an insufficient amount for transistor saturation.

| | Ohms |
|---|---|
| Resistor **46** | 4750 |
| Resistor **56** | 3400 |
| Resistor **66** | 499 |
| Resistor **76** | 357 |

In the circuit diagrams illustrated in Figs. 1 and 2, particularly conductivity type transistors are shown in an arrangement such that the control signals applied to the first and fourth transistors are negative going signals. In the event that it is desired to provide a circuit in which positive going control signals are utilized, the PNP transistors can be replaced by NPN transistors and the NPN transistors replaced by PNP transistors. This would of course necessitate a reversal of the polarities of the various points of potential and also a reversal of the clamping diodes.

There has thus been disclosed a bistable circuit having "set" and "reset" capability and which requires a minimum amount of time to change from one stable condition to the other. In addition, the bistable circuit provided in accordance with the present invention accommodates internal gating arrangements in a simplified manner which makes it particularly adaptable for use in high speed computing or counting circuitry.

What is claimed is:

1. A bistable circuit comprising in combination: first and second transistors of opposite conductivity type each having a base, an emitter, and a collector; a first resistive impedance element having one terminal connected to the collector of said first transistor and to the emitter of said second transistor; a third transistor having a control electrode connected to the collector of said second transistor and a load circuit including a second resistive impedance element; and means including a source of potential connected to the other terminal of said first impedance element and to each of said transistors rendering said second transistor nonconductive in response to voltages across said first impedance element associated with current flow through said first transistor and rendering said first transistor nonconductive in response to voltages across said second impedance element associated with current flow through said load circuit.

2. A bistable circuit comprising in combination, first and second semiconductor signal translating devices of opposite conductivity type each having a base, an emitter, and a collector, a first resistor having one terminal connected to the emitter of said first device and to the collector of said second device, voltage clamping means connected to the emitter of said first device, bias means coupled with said devices and said resistor for rendering the state of conduction of said first device responsive to the voltage across said resistor associated with current flow through said second device, a third semiconductor signal translating device having a control electrode coupled with the collector of said first device and an emitter-collector circuit connected to the emitter of said second device, a second resistor having one terminal connected to a source of potential and another terminal connected to the emitter-collector circuit of said third device and to the emitter of said second device rendering the state of conduction of said second device responsive to the voltage across said second resistor associated with current flow through the emitter-collector circuit of said third device, and means including a fourth semiconductor signal translating device coupled with said second resistor adapted to selectively render said second device nonconductive in response to control signals.

3. A bistable circuit comprising in combination, first and second transistors of opposite conductivity type each having base, emitter and collector electrodes, a first resistive impedance element having one terminal connected to the emitter electrode of said first transistor and to the collector electrode of said second transistor, a second resistive impedance element having one terminal connected to the collector electrode of said first transistor, a third resistive impedance elevent having one terminal connected to the emitter electrode of said second transistor, voltage limiting means connected to the emitter of said first transistor, a third transistor having a base electrode coupled to the collector electrode of said first transistor and an emitter-collector circuit coupled to said one electrode of said third impedance element, a fourth transistor having an emitter-collector circuit coupled to said one electrode of said third impedance element and a control electrode adapted to have control signals applied thereto, means including a source of potential coupled with each of said transistors and with the other terminal of each of said impedance elements adapted to render said first transistor nonconductive in response to current flow common to said second transistor and said first impedance element and to render said second transistor nonconductive in response to current flow common to said third transistor and said third impedance element, and signal input means coupled with the base of said first transistor and the control electrode of said fourth transistor.

4. A bistable circuit comprising: first and second transistors of one conductivity type and a third transistor of another conductivity type, each of said transistors having a base electrode, an emitter electrode, and a collector electrode; a first resistor having one terminal connected to a source of potential and another terminal connected to the collector electrode of said first transistor and to the emitter electrode of said third transistor adapted to provide a first signal in response to conduction of said first transistor; means rendering said third transistor nonconductive during said first signal and conductive in the absence of said first signal; means including a second resistor having one terminal connected to a source of potential and another terminal connected to the base electrode of said second transistor and to the collector electrode of said third transistor adapted to maintain said second transistor conductive only during conduction of said third transistor; a third resistor having one terminal connected to a source of potential and another terminal connected to the emitter electrodes of said first and second transistors adapted to provide a second signal during conduction of said second transistor; means rendering said first transistor nonconductive in response to said second signal and conductive in the absence of said second signal; and signal input circuit means coupled with said first and third transistors.

5. A bistable circuit comprising: first, second, and third transistors of one conductivity type each having a base, an emitter, and a collector; a fourth transistor of another conductivity type having an emitter connected to the collector of said first transistor, a collector connected to the base of said second transistor, and a base; a first resistor connected to the emitter of said fourth transistor; a second resistor having one terminal connected to the emitters of said first, second, and third transistors; a third resistor connected to the collector of said fourth transistor; means connecting the collector of said second transistor to the collector of said third transistor; and means including a source of potential connected to each of said resistors maintaining said first and fourth transistors in opposite states of conduction and adapted to prevent saturation of said transistors.

6. A bistable circuit as defined in claim 5 and including a fifth transistor of the same conductivity type as said third transistor and having an emitter connected to the emitter of said third transistor, a collector connected to the collector of said third transistor, and a control electrode adapted to receive control signals.

7. A bistable circuit as defined in claim 5 and including a fifth transistor of the same conductivity type as said fourth transistor and having an emitter connected to the emitter of said fourth transistor, a collector connected to the collector of said fourth transistor, and a control electrode adapted to receive control signals.

8. A bistable circuit as defined in claim 7 and including a sixth transistor of the same conductivity type as said third transistor and having an emitter connected to the emitter of said third transistor, a collector connected to the collector of said third transistor, and a control electrode adapted to receive control signals.

9. A bistable circuit having set and reset capability utilizing transistors operated in their non-saturated regions of operation comprising in combination, first and second transistors of opposite conductivity type each having base, emitter, and collector electrodes, means including a first resistor having one terminal connected to a source of potential and another terminal connected to the collector electrode of said first transistor and to the emitter electrode of said second transistor adapted to maintain said second transistor nonconductive during conduction of said first transistor, voltage clamping means connected to the collector electrode of said first transistor, a third transistor of conductivity type opposite that of the second transistor having a base electrode connected to the collector electrode of said second transistor and an emitter electrode connected to the emitter electrode of said first transistor, means including a second resistor having one terminal connected to a source of potential and another terminal connected to the emitter electrodes of said first and third transistors adapted to maintain said first and third transistors in opposite states of conduction, a fourth transistor having an emitter-collector circuit connected to the emitter electrode of said first transistor and a control electrode adapted to receive control signals, means including said second resistor rendering said first transistor nonconductive in response to conduction of said fourth transistor, and a signal input circuit connected to the base of said second transistor.

10. A bistable circuit adapted to assume a first stable condition in response to a first control signal applied to a first signal input terminal and to assume a second stable condition in response to a second control signal applied to a second signal input terminal comprising in combination: first, second, and third PNP transistors and a fourth NPN transistor, each of said transistors having a base electrode, an emitter electrode, and a collector electrode; a first resistor connected between a first point of fixed potential and the emitter electrodes of each of said PNP transistors; a second resistor connected between a second point of fixed potential and the emitter electrode of said fourth transistor; circuit means providing a direct current path between the collector electrode of said first transistor and the emitter electrode of said fourth transistor; a third resistor connected between a third point of fixed potential and the collector electrode of said fourth transistor, circuit means providing a direct current path between the collector electrode of said fourth transistor and the base electrode of said second transistor; voltage limiting means connected to the emitter of said fourth transistor; and means connected to the base electrodes of said first, third, and fourth transistors maintaining the base of said first transistor at a fixed potential, the base of said fourth transistor at a potential which is constant in the absence of said first signal, and the base of said third transistor at a potential which is constant in the absence of said second signal.

11. A bistable circuit as defined in claim 10 and including an additional PNP transistor having a control electrode adapted to receive input signals and an emitter-collector circuit connected to said first resistor.

12. A bistable circuit as defined in claim 11 and including an additional NPN transistor having a collector electrode connected to said third resistor, a control electrode adapted to receive input signals, and an emitter electrode connected to said second resistor.

References Cited in the file of this patent

UNITED STATES PATENTS

| | | |
|---|---|---|
| 2,663,800 | Herzog | Dec. 22, 1953 |
| 2,744,198 | Raisbeck | May 1, 1956 |
| 2,770,732 | Chong | Nov. 13, 1956 |
| 2,820,155 | Linville | Jan. 14, 1958 |
| 2,827,574 | Schneider | Mar. 18, 1958 |